United States Patent [19]

Herberg

[11] Patent Number: 4,633,288
[45] Date of Patent: Dec. 30, 1986

[54] LIGHT-TRIGGERABLE THYRISTOR HAVING LOW LIGHT POWER REQUIREMENT AND HIGH CRITICAL VOLTAGE RISE RATE

[75] Inventor: Helmut Herberg, Munich, Fed. Rep. of Germany

[73] Assignee: Siemens Aktiengesellschaft, Berlin and Munich, Fed. Rep. of Germany

[21] Appl. No.: 495,750

[22] Filed: May 18, 1983

[30] Foreign Application Priority Data

Jul. 16, 1982 [DE] Fed. Rep. of Germany ....... 3226624

[51] Int. Cl.<sup>4</sup> ............... H01L 29/74; H01L 31/08; H01L 31/10
[52] U.S. Cl. ............................. 357/38; 357/39; 357/30; 357/51; 357/2
[58] Field of Search ......... 357/38, 38 LA, 39, 39 LA, 357/30 L, 51, 2 (U.S. only)

[56] References Cited

U.S. PATENT DOCUMENTS 4,217,374  8/1980  Ovshinsky et al. ............... 357/2
4,224,634  9/1980  Suedberg ........................... 357/38

FOREIGN PATENT DOCUMENTS 2904424  8/1980  Fed. Rep. of Germany .
53-25386  3/1978  Japan ................................ 357/30 I
56-91459  7/1981  Japan ................................ 357/51

OTHER PUBLICATIONS

G. Hatzinger, "Optoelektronische Bauelemente und Schaltungen" Siemens Aktiengesellschaft, 1977, pp. 36–41, 54–67.

Primary Examiner—Martin H. Edlow
Assistant Examiner—Jerome Jackson
Attorney, Agent, or Firm—Hill, Van Santen, Steadman & Simpson

[57] ABSTRACT

A thyristor comprises a semiconductor body containing a n emitter contacted by a cathode electrode and an adjacent p base, with a p emitter contacted by an anode electrode and an adjacent n base. The thyristor comprises a projection of the p base which extends up to the cathode boundary surface of the semiconductor body and likewise comprises a projection of the n base extending up to the boundary surface and which is adjacent to the first-mentioned projection. A gate electrode is carried insulated on the boundary surface covering the projection of the p base and serves to control the thyristor. Triggerability of the thyristor by a low light power and the attainment of a high critical voltage rise rate $dU/dt$ relative to an inhibit voltage U is achieved by an illuminatable, light-sensitive resistor for ignition which is connected between the gate electrode and the projection of the n base and a further resistor which is connected between the gate electrode and the cathode electrode. The invention finds particular use in power semiconductors.

8 Claims, 4 Drawing Figures

LIGHT-TRIGGERABLE THYRISTOR HAVING LOW LIGHT POWER REQUIREMENT AND HIGH CRITICAL VOLTAGE RISE RATE

CROSS REFERENCE TO RELATED APPLICATION

This application is related to my application Ser. No. 495,800 filed 5-18-83, now U.S. Pat. No. 4,587,546 issued 5-6-86.

BACKGROUND OF THE INVENTION

1. Field of the Invention

The present invention relates to a thyristor having a semiconductor body containing an n emitter contacted by a cathode electrode and having an adjacent p base and containing a p emitter contacted by an anode electrode and having an adjacent n base which is, in turn, adjacent to the p base, and which comprises a projection of the p base which extends up to a boundary surface of the semiconductor body, a projection of the n base adjacent thereto and likewise extending up to the boundary surface, and a gate electrode disposed on the boundary surface, insulated therefrom and covering the projection of the p base.

2. Description of the Prior Art

A thyristor of the type generally set forth above is known from the German allowed and published application No. 29 04 424. In that disclosure, a portion of the n emitter which is adjacent to the projection of the p base extending to the boundary surface represents the source region of a metal-insulator-semiconductor-field effect transistor (MIS-FET) controllable by way of the gate electrode whose drain region is formed by the projection of the n base extending to the boundary surface. When a voltage is supplied to the gate electrode, the voltage lying above the threshold voltage, then a current flows from the load circuit of the thyristor over the MIS-FET into the n base, whereby triggering is initiated.

SUMMARY OF THE INVENTION

The object of the present invention is to provide the thyristor of the type generally set forth above as a light-triggerable thyristor, in particular, such that it can be triggered with a very low light power despite a high critical voltage rise rate dU/dt relative to an adjacent inhibit voltage U. This is achieved according to the present invention, in a device of the type set forth above wherein an illuminatable, light-sensitive resistor for triggering the thyristor is connected, on the one hand, to the gate electrode and, on the other hand, contacts the projection of the n base within a space charge zone produced at the pn junction to the projection of the p base in the inhibiting condition of the thyristor, and wherein a further resistor is connected between the gate electrode and the cathode electrode.

The advantage attainable with the present invention is, in particular, that a sub-voltage derived over the light-sensitive resistor which is supplied to the gate electrode can be adjusted in a simple manner such that it lies only slightly below the threshold voltage of the MIS-FET in the non-illuminating condition of the resistor. Given only weak illumination of the resistor, such a voltage rise already occurs at the gate electrode that the MIS-FET becomes conductive, whereby the thyristor quickly and reliably triggers. Completely independentlycf the high trigger sensitivity thereby produced, the thyristor is designed such that it exhibits a high blocking capability and, in particular, exhibits a high critical voltage rise rate dU/vt relative to an forward voltage U applied between the anode and cathode electrodes, this being achieved in a traditional manner, for example, by incorporating emitter short circuits.

BRIEF DESCRIPTION OF THE DRAWINGS

Other objects, features and advantages of the invention, its organization, construction and operation will be best understood from the following detailed description, taken in conjunction with the accompanying drawings, on which.

DESCRIPTION OF THE PREFERRED EMBODIMENTS

Figure 1:
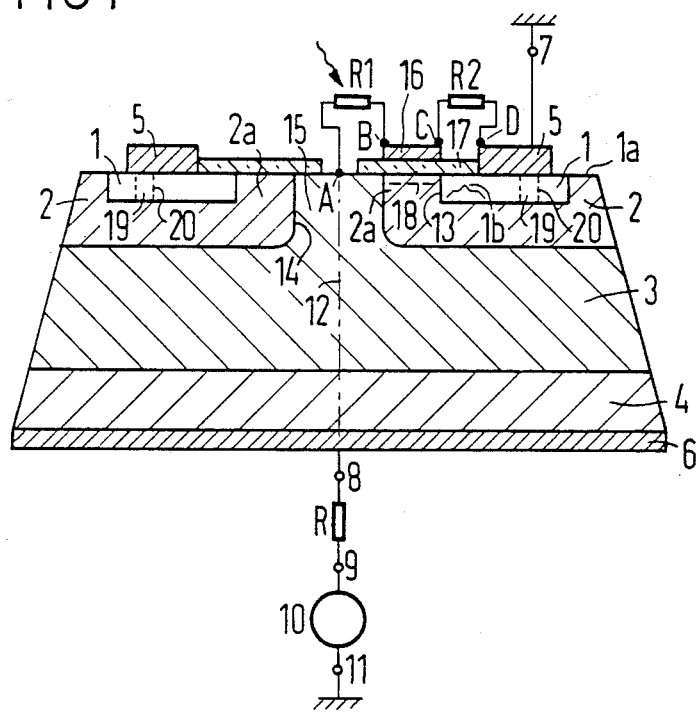
FIG. 1 is a cross sectional and schematic diagram of an exemplary embodiment of the invention.

A thyristor having a semiconductor body of doped semiconductor material, for example silicon, which exhibits four successive layers of alternate conductivity type is illustrated in FIG. 1. The layers are a matter of an n emitter 1, a p base 2, and n base 3 and a p emitter 4. The n emitter 1 is provided with a cathode electrode 5, the p emitter 4 is provided with an anode electrode 6 and the electrodes comprise an electrically-conductive material, for example aluminum. The electrode 5 is connected to ground by way of a terminal 7, while the electrode 6 is connected over a terminal 8 and a load resistor R to a terminal 9 of a voltage source 10 whose other terminal 11 is connected to ground.

The p base 2 comprises a projection 2a which extends up to the cathode boundary surface 1a of the semiconductor body. Given a dynamically-balanced thyristor format, which is indicated by the dot-dash axis of symmetry 12, the portions 1 and 5 are annularly designed, whereby a central recess 13 of the n emitter 1 is filled by the central projection 2a. When, on the other hand, the n emitter 1 exhibits a strip structure, which is to be interpreted as meaning that the illustrated portions 1 and 5 are respectively designed strip-like and, for example, extend over the entire boundary surface 1a or over significant portions thereof at right angles relative to the plane of the drawing of FIG. 1, then the projection 2a represents a bar which is likewise strip-shaped and which separates the parts 1 from one another. Thereby, the parts 1 can be connected to one another at their ends so that a U-shaped emitter structure arises. The parts 1 can also be shaped such that they extend in the boundary surface 1a according to an arbitrary curve (spirals or the like).

The projection 2a of the p base 2 comprises a recess 14 which is filled by a projection 15 of the n base 3 which extends up to the boundary surface 1a. The recess 14 and the projection 15 can, corresponding to the projection 2a, be designed circularly or strip-like.

A gate electrode 16 covers the right-hand portion of the projection 2a extending to the boundary surface 1a and is separated from the boundary surface 1a by an electrically insulating layer 17. Thereby, the sub-region 1b of the n-emitter 1 forms the source region, the right-hand portion of the projection 2a forms the channel region and the portion of the projection 15 adjacent thereto forms the drain region of an n-channel MIS-FET, i.e. of a field effect transistor having a metal-insulator-semiconductor format which is driven over the gate electrode 16. When a sufficiently-large positive voltage is applied to the latter, then an inversion channel 18 is formed at the boundary surface 1a below the gate 16, the inversion channel representing a low-resistance connection between the n emitter 1 and the n base 3. Under the influence of an forward voltage which positively biases the terminal 8 relative to the terminal 7, electrons are then transported from the n emitter 1 over the channel 18 into the n base 3, whereby an emission of holes from the p junction between the elements 3 and 4 in the direction towards the n emitter 1 and, as a further consequence, an emission of electrons from the p junction between the elements 1 and 2 in the direction towards the p emitter 4 are produced. These mutually-intensifying events effect a fast and large-surface ignition of the thyristor.

Figure 2:
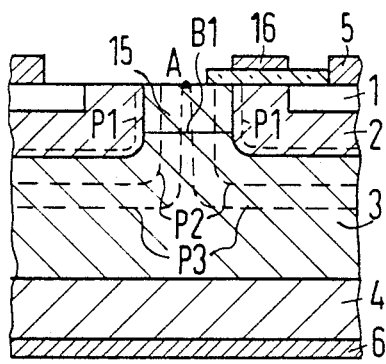
FIG. 2 is a fragmentary sectional view illustrating the course of the space charge zone forming along the pn junction between the p base and the n base given a low forward voltage.
Figure 3:
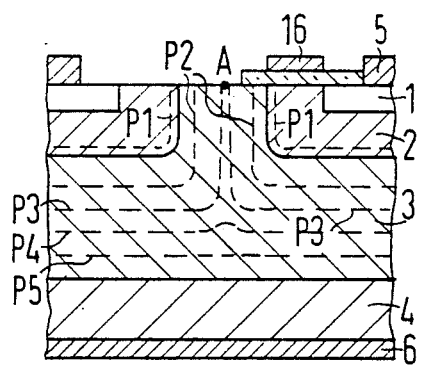
FIG. 3 is a fragmentary sectional view illustrating the course of the space charge zone given a high forward voltage.

FIG. 2 illustrates the course of the space charge zone which derives between the electrodes 5 and 6 at the p junction between the p base 2 and the n base 3 polarized in the non-conducting direction in FIG. 1 given a low forward voltage, whereas FIG. 3 represents the course of the space charge zone given a high forward voltage. Isoelectric lines P1-P5 respectively correspond to fixed potential values. If one proceeds from the fact in FIG. 2 that the electrode 5 lies at ground and the electrode 6 is connected to an forward voltage U1, then the line P1 which limits the space charge zone towards the top corresponds to a very low potential value which differs only slightly from zero, P2 corresponds to a mean potential value and the line P3 which limits the space charge zone towards the bottom corresponds to a potential value which approximately corresponds to the voltage value U1. Thereby, a point A in the boundary surface 1a also exhibits the potential value P3. With U1 selected such that the sections of the isoelectric lines P3 extending approximately perpendicularly meet at the point A. Given a width B1 of the projection 15 of approximately 50–200 μm, the voltage U1, given which a configuration of the space charge zone according to FIG. 2 occurs, lies between, for example, 20 and 200 volts depending on the degree of doping of the n base 3.

When the voltage at the electrode 6 is increased above the value U1 (FIG. 3), then the space charge zone enlarges, this being indicated by the added isoelectric lines P4 and P5. The isoelectric line P5 then limits the space charge zone towards the bottom and indicates a potential value which approximately corresponds to the increased voltage at the electrode 6. It is thereby essential that each increase of the voltage at the electrode 6 up to the value U1 results in a corresponding increase of the potential at the point A, whereas each increase above the value U1 practically no longer changes the potential at the point A.

A light-sensitive resistor R1 is illustrated in FIG. 1 which, on the other hand, contacts the projection 15 of the n base 3 at the point A and, on the other hand, is connected to the gate electrode 16. The junction of the resistor R1 and the gate electrode 16 is thereby referenced B for a better understanding of the circuit diagram and is placed at the left-hand end of the gate electrode 16. What is meant by a light-sensitive resistor is every resistor whose value of resistance decreases under the influence of light. For example, such a resistor can be a photo resistor as disclosed in the book of G. Hatzinger, "Optoelektronische Bauelemente und Schaltungen", published by Siemens AG, Berlin and Munich, 1977, pp. 36–41. A further resistor R2 is connected between the gate electrode 16 and the cathode electrode 5, whereby the junctions C and D are likewise respectively indicated at the right-hand end of the electrode 16 and that the left-hand end of the electrode 5 for reasons of clarity of illustration.

When the resistor R1 has a value of resistance $R_{AB}$ without illumination and the resistor R2 has a value of resistance $R_{CD}$, then, given a voltage $U_A$ at the point A, a voltage $U_G$ according to the following relationship derives at the gate electrode 16 because of the voltage division by the resistors R1 and R2:

$$U_G = \frac{R_{CD}}{R_{AB} + R_{CD}} \cdot U_A. \tag{1}$$

The values of resistance $R_{AB}$ and $R_{CD}$ are selected such that the value $U_G$ is lower than the threshold voltage of the MIS-FET. When the light-sensitive resistor R1 is illuminated, then its value of resistance is reduced from $R_{AB}$ to $R_{AB'}$, whereby the voltage $U_{G'}$ of the following size occurs at the electrode 16:

$$U_{G'} = \frac{R_{CD}}{R_{AB'} + R_{CD}} \cdot U_A. \tag{2}$$

The voltage $U_{G'}$ thereby lies above the threshold voltage of the MIS-FET so that the inversion channel 18 is formed, over which the thyristor receives a gate trigger current from the load circuits 7–11 given and applied forward voltage, the gate trigger current triggering the thyristor very quickly. The resistance values $R_{AB}$ and $R_{CD}$ are advantageously selected such that the voltage $U_G$ lies just below the threshold voltage so that the threshold voltage is sure to be exceeded by the voltage value $U_{G'}$ even given a small resistance differential $R_{AB}-R_{AB'}$. This, however, means that the thyristor exhibits high trigger sensitivity. Completely independently thereof, the thyristor, by applying suitable measures known per se, exhibits a high inhibit capability against high forward voltages U between the terminals 7 and 8. Simultaneously, these measures guarantee a high critical voltage rise rate dU/dt up to which an undesired triggering of the thyristor is reliably avoided. Included among these measures, for example, is the introduction of fixed emitter short circuits at the n emitter 1. These short circuits comprise projections 19 of the p base 2 which fill corresponding recesses 20 of the n emitter 1 and extend up to the boundary surface 1a in which they are contacted by the electrode 5.

Given a thyristor according to FIG. 1, the two parameters of trigger sensitivity and inhibit capability can, deriving from the above, be set largely independently of one another, i.e. decoupled from one another.

Figure 4:
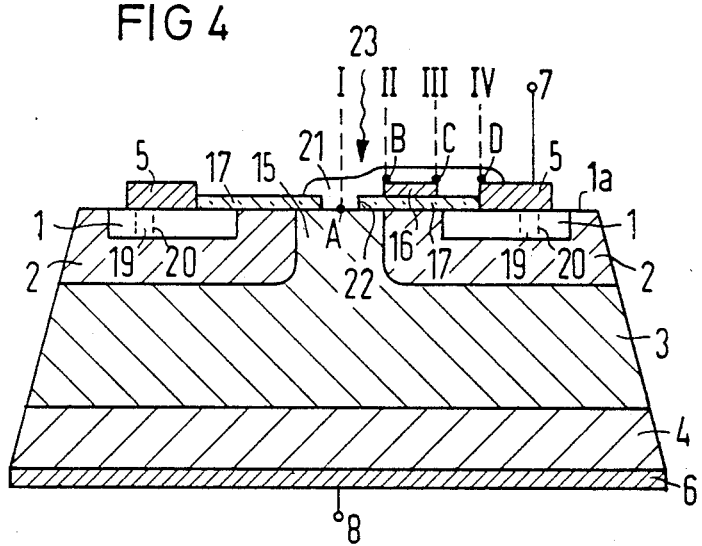
FIG. 4 is a cross sectional and schematic illustration of a preferred exemplary embodiment of the invention according to FIG. 1.

FIG. 4 illustrates an embodiment of the thyristor according to FIG. 1 wherein the resistors R1 and R2 are realized by a resistance-affected layer 21 having an exposure-dependent resistance which is applied over the insulating layer 17 and the gate electrode 16.

Thereby, it fills out a recess 22 of the insulating layer 17 extending up to the boundary surface 1a and contacts the projection 15 of the p base 3 in the area of the point A (FIG. 1). The unilluminated layer 21 exhibits the value of resistance $R_{AB}$ between the points A and B and exhibits the value of resistance $R_{CD}$ between the points C and D. The value of resistance $R_{AB}$ can be illustrated in FIG. 4 by, for example, the mutual spacing of cross sectional planes I and II extending through the points A and B, while the value of the resistance $R_{CD}$ can be visualized by the mutual spacing of the cross sectional planes III and IV which extend through the points C and D. The resistance of the layer 21 between the planes II and III, as well as to the right of the plane IV, is negligible because of the high conductivity of the electrodes 16 and 5.

When the section lying between the planes I and II is illuminated with incident light 23, then the value of resistance of the layer 21 measured between the points A and B drops from $R_{AB}$ to $R_{AB'}$. The layer 21 advantageously comprises amorphous silicon. Given exposure with visible light, its specific resistance value drops from, for example, $10^7 \Omega cm$ to $10^3 \Omega cm$. the other hand, the layer 21 can also comprise a material which is employed for photoresistors such as, for example, cadmium sulfide or cadmium selenide.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. In a thyristor of the type in which a semiconductor body has a boundary surface and comprises an n emitter extending to the boundary surface and contacted by a cathode electrode, a p base adjacent the n emitter, an n base adjacent the p base and a p emitter adjacent the n base and contacted by an anode electrode, in which a p projection of the p base and an n projection of the n base extend adjacent one another up to the boundary surface, in which a gate electrode is carried over and insulated from the p projection, the improvement therein comprising:
    an illuminatable, light-sensitive first resistor for triggering the thyristor connected to the gate electrode and to a contact point of the n projection in a space charge zone produced at the pn junction with the p projection in the inhibiting condition of the thyristor; and
    a second resistor connected between the gate electrode and the cathode electrode.

2. The improved thyristor of claim 1, wherein said first and second resistors comprise:
    a layer of exposure-dependent resistance material extending over and contacting the contact point of the n projection and otherwise insulated from the n projection, extending over and contacting the gate electrode, and extending to and contacting the emitter electrode, the portion of the layer between the contact point and the gate electrode constituting the first resistor and the portion of the layer between the gate and emitter electrodes constituting the second resistor.

3. The improved thyristor of claim 2, wherein the exposure-dependent resistance material comprises amorphous silicon.

4. The improved thyristor of claim 2, wherein the exposure-dependent resistance material comprises cadmium sulfide.

5. The improved thyristor of claim 2, wherein the exposure-dependent resistance material comprises cadmium selenide.

6. The improved thyristor of claim 1, wherein:
    the p base includes a recess therein extending up to the boundary surface; and
    the n projection fills the recess.

7. The improved thyristor of claim 1, wherein:
    at least one of the emitters comprises short circuits from the adjacent base to the respective electrode.

8. In a thyristor of the type in which a semiconductor body has a boundary surface and comprises a first emitter of a first conductivity type extending to the boundary surface and contacted by a first electrode, a first base of an opposite, second conductivity type adjacent the first emitter, a second base of the first conductivity type adjacent the first base and a second emitter of the second conductivity type adjacent the second base and contacted by a second electrode, in which a first projection of the first base and a second projection of the second base extend adjacent one another up to the boundary surface, in which a gate electrode is carried over and insulated from the first projection, the improvement therein comprising:
    an illuminatable, light-sensitive first resistor for triggering the thyristor connected to the gate electrode and to a contact point of the second projection in a space charge zone produced at the junction with the first projection in the inhibiting condition of the thyristor; and
    a second resistor connected between the gate electrode and the cathode electrode.

* * * * *